United States Patent [19]
Will et al.

[11] Patent Number: 6,051,438
[45] Date of Patent: Apr. 18, 2000

[54] STRUCTURAL ANALYSIS AND VERIFICATION OF STRUCTURES OF CHEMICAL COMPOUNDS

[75] Inventors: Martin Will, Mannheim; Winfried Fachinger, Trechtingshausen, both of Germany

[73] Assignee: BASF Aktiengesellschaft, Ludwigshafen, Germany

[21] Appl. No.: 08/969,776

[22] Filed: Nov. 13, 1997

[30] Foreign Application Priority Data

Nov. 13, 1996 [DE] Germany ............... 196 46 906

[51] Int. Cl.⁷ ................................................. G01N 33/00
[52] U.S. Cl. ..................... 436/173; 324/300; 436/139; 436/140; 436/141; 436/142
[58] Field of Search .................... 436/173, 139–142; 324/300

[56] References Cited

PUBLICATIONS

R.A. Newmark Comput. Chem. 1986, 10, 223–228.
P.C. Jurs Chemtracts: Anal., Phys., Inorg. Chem. 1990, 2, 507–509.
J.T. Clerc et al, Anal. Chim. Acta 1977, 95, 33–40.
N.A.B. Gray et al, J. Org. Chem. 1981, 46, 703–715.
R.M. Silverstein et al. "Spectometric Identification of Organic Compounds" John Wiley & Sons: New York, 1981, pp. 249–281.
S. Belaid et al, J. Chim. Phys. Physichim. Biol. 1985, 82, 594–605.
W. Bremser et al, Magn. Resom. Chem. 1985, 23, 1056–1071.
K. Funatsu et al., Fresenius' Z Anal. Chem. 1986, 324, 750–759.
J. Zhang et al, Anal. Chim. Acta 1988, 210, 163–167.
R.A. Hearmon et al, Magn. Reson. Chem, 1992, 30, 240–248.
E. Pretsch et al, J. Chem. Inf. Comput. Sci 1992, 32, 291–295.
S. Yuan et al, Sci. China, Ser. A 1992, 35, 1136–1143.
H.N. Chen et al, Anal Chim. Acta 1994, 285, 233–235.
S.V. Trepalin et al, J. Chem. Inf. Comput. Sci 1995, 35, 405–411.
M. Will et al., J. Chem. Inf. Comput. Sci 1996, 36, 221–227.
H. Hönig Magn. Reson. Chem. 1996, 34, 395–415.
W. Bremser Anal. Chem. Acta, vol 103, 1978, pp. 355–365.
L. Chen et al. J. Chem. Inf. Comput. Sci., vol. 33, 1993, pp. 441–446.
L. Chen et al. J. Chem. Inf. Comput. Sci., vol. 33, 1993, pp. 447–452.

Primary Examiner—Arlen Soderquist
Attorney, Agent, or Firm—Keil & Weinkauf

[57] ABSTRACT

In the course of a method for the structural analysis of a chemical compound by data signals measured with the chemical compound being compared with calculated data, a first data signal is generated for at least one first compound having a structure which is similar to the assumed structure and has the same first substructure, but a different substituent Sv (instead of the substituent Sa of the compound being studied) in the substitution position; a second data signal is generated which constitutes the difference between the data from a second Sv-substituted compound and an unsubstituted (third) compound; a third data signal is generated which constitutes the difference between the data from a fourth Sa-substituted compound and an unsubstituted compound; a fourth data signal is generated from the first three data signals, and the measured data signal and the fourth data signal are compared with one another.

5 Claims, 2 Drawing Sheets (I)

(II)

(III)

(I)

(II)

(III)

STRUCTURAL ANALYSIS AND VERIFICATION OF STRUCTURES OF CHEMICAL COMPOUNDS

The invention relates to methods for the structural analysis of chemical compounds. In particular the invention relates to analytical procedures and methods which are based on NMR measurements of chemical compounds.

The analysis of chemical compounds often requires an assumed chemical structure of one or more compounds or a mixture to be verified. If the compounds of the structure to be verified are not available for comparison, the verification must be carried out by a comparison with data of known compounds.

These days, structural validations are carried out with the aid of NMR data. One of the options involved is the comparison of the measured NMR data with known data from substructures covered or coded by means of the HOSE code. HOSE codes describe substructures in spheres. In the case of three-sphere HOSE codes all those atoms around a central atom are covered which are within a distance of up to 3 bonds from said atom (compare W. Bremser, Anal. Chem. Acta Volume 103, 1978, pp. 355–365, "HOSE—a novel substructure code"). Another procedure compares the measured NMR data with data of compounds which carry identical substitutions on an identical core, e.g. a benzene ring. This system is also referred to as increment system.

Both systems have drawbacks. Frequently the data from the known substructures are not sufficient for acceptable reliability of the verification. In the case of aromatic compounds, the substituents in the meta and para position often cannot be taken into account. Increment-based predictions often fail in the case of ortho-substituted S aromatic compounds, because steric effects cannot be taken into account. Moreover, in the course of computations carried out on highly substituted compounds, small deviations of the increments add up to significant errors.

In J. Chem. Inf. Comput. Sci. 33, 441–446 and 447–452, L. Chen and W. Robien described methods for the automatic analysis of substituent-induced differences in the chemical shift for $^{13}$C-NMR spectra. They have pointed out efficient MCSS algorithms and sophisticated strategies. These methods, however, were described for the analysis of compounds having completely or largely unknown structures. Analysis times, i.e. computing times of 3 hours or 50 minutes have been reported. These methods are too slow and too laborious for routine verifications of structures. Considerable programming effort is required to carry out the sophisticated strategies.

It is an object of the present invention to specify a method for the structural analysis and structural verification for chemical compounds, which can be carried out simply and rapidly, utilizes existing data and is able to work with known programs.

We have found that this object is achieved by methods as described hereinafter. Preferred embodiments are illustrated in the examples.

According to the invention, a method for the structural analysis of a chemical compound by means of data or data signals measured with the chemical compound being compared with calculated data (calculated data signals) has been improved. In particular, greater accuracy and reliability of the results of the method have been obtained. This was achieved by the following features:

a. The compound studied has an assumed structure having a first substructure S1 comprising a substitution position and a substitution Sa situated therein. The compound studied was subjected to the measurement and a measured data signal was generated.

b. A first data signal is determined for at least one first compound of a structure which is similar to the assumed structure and has the same first substructure S1, but a different substituent Sv in the substitution position. Instead of Sa, Sv is therefore present in the substitution position.

c. A second data signal is determined which constitutes the difference between the data from a second compound having a second substructure S2 which is present in the first substructure S1 and likewise has the substitution position and therein carries the substituent Sv, and those from a third compound which matches the second compound, but does not carry the substituent Sv in the substitution position. This second data signal as it were represents the contribution of Sv to the measurement result with the second compound, compared with the second compound not substituted with Sv.

d. A third data signal is determined which constitutes the difference between the data from a fourth compound having a third substructure S3 which is present in the first substructure S1 and likewise has the substitution position and therein carries the substituent Sa, and those from a fifth compound which matches the fourth compound, but does not carry the substituent Sa in the substitution position. Again, the third data signal represents the contribution of Sa to the measurement result on the Sa-substituted compound compared with the compound unsubstituted in that respect.

Rather than using the second and third data signals themselves, which after all represent increments or data differences, it is of course also possible to use the data or data signals on which these are based. Throughout, for that matter, any statements on how the computations are carried out should be seen as conceptual; other methods based on the same principle of increment compensation between partially matching structures can also be used.

The second and third substructure (S2 and S3) may be identical. In the examples they are identical, being benzene rings.

e. A fourth data signal is calculated by means of the first data signal being corrected, with the aid of the second data signal and the third data signal, to a data signal which corresponds to the assumed structure.

f. The measured data signal and the fourth data signal are compared with one another.

The novel method is eminently suitable for verifying assumed structures. Equally, however, according to the invention the method can be used for analyses of chemical compounds having an unknown or largely unknown structure. In that case, the method is automatically carried out repeatedly for the various possible structures, and the structure with the lowest deviation or the lowest sum of deviations (in the case of $^{13}$C-NMR: sum of the deviations relating to the shifts associated with the individual C atoms) is indicated.

The various possible structures which are to be verified may be automatically generated by a structure generator. Automatic generation of possible structures may be performed by superposition of known substructures. For the automatically generated possible structures the process according to the invention for verifying assumed structures is carried out, yielding the structure with the lowest sum of deviations as the correct structure. Therefore, the process according to the invention is well suited for automatic structure elucidation, which can be subdivided into individual steps comprising the analysis for generating measured data, the structure generation and the structure validation. Verifying the assumed structure is the key step to automatic structure elucidation and requires fast and precise spectra prediction in order to determine the correct structure among the possibly large number of possible structures. Due to its high precision in predicting spectra, the process according to the invention is particularly well suited for automatic structure elucidation.

In a preferred method, at least one first standardized data signal is determined by means of the increment for the substitution Sv, corresponding to the difference between the data from the second and third compounds, being subtracted from the corresponding first data signal, and the increment for the substitution Sa, corresponding to the difference between the data from the fourth and fifth compound, being added to the first standardized data signal. A method found particularly useful in this context is one in which a plurality of first data signals is determined for a corresponding plurality of different first compounds, for each of the different first compounds the corresponding second data signal is determined for the respective substitution Sv of said first compounds and is subtracted from the first data signal, and a mean is formed as the mean first standardized data signal, from the individual results obtained. Surprisingly, this way of forming a mean leads to improved results even if no selection (for example from chemical points of view) is made among the available substructures.

The mean first standardized data signal thus formed by averaging then has the third data signal added to it, for the fourth data signal to be obtained.

Preference is further given to a method in which the first data signal and the component signals of the second data signal and of the third data signal, or the second data signals and the third data signals themselves are calculated automatically as a digital signal word from a computer on the basis of the input of the substructures and substitutions.

The measured data signals, the first, second and third data signals and their component signals preferably represent $^{13}$C-NMR signals, in particular the respective chemical shifts for the corresponding compounds or substituents, wherein the substitution Sa with respect to the C atom under consideration preferably represents a remote substitution, in the case of aromatic compounds often a substitution on the fourth atom (4th sphere) starting from the atom under consideration as the first atom, in particular a p-substitution on an aromatic compound. However, the invention can also be applied to aliphatic compounds, often comprising substructures with known results, which have atoms up to 2 bonds away from the atom being studied. The novel method is particularly suitable for situations in which data on structures with fourth-sphere HOSE codes are not yet known. This involves processing of data, in particular NMR analysis results, preferably $^{13}$C-NMR analysis results of substructures having 2 or 3 known atomic spheres.

What was found particularly useful in the methods working with $^{13}$C-NMR spectra or data of such spectra was to employ structural coding in accordance with the HOSE code. Said coding of structures allows all compounds and substructures to be covered unambiguously, and any values (shifts) present can be calculated rapidly from the database.

A further method according to the invention is used for the structural analysis of chemical compounds, in which said method involves subjecting the chemical compound to an analytical procedure to generate a datum as the basis for generating a measured data signal. The measured data signal is compared with a calculated data signal, the calculated data signal being determined as stated above.

All the data signals may be conventional electric data signals. Particularly suitable, however, for achieving high processing speeds are digitally coded data signals, particularly those from a digital storage device such as a database. With this preferred embodiment, the search for the suitable data signal becomes rapid and simple.

The following examples contain preferred embodiments and preferred individual features of the invention, without the invention being limited thereto.

EXAMPLE 1

Figure 1:
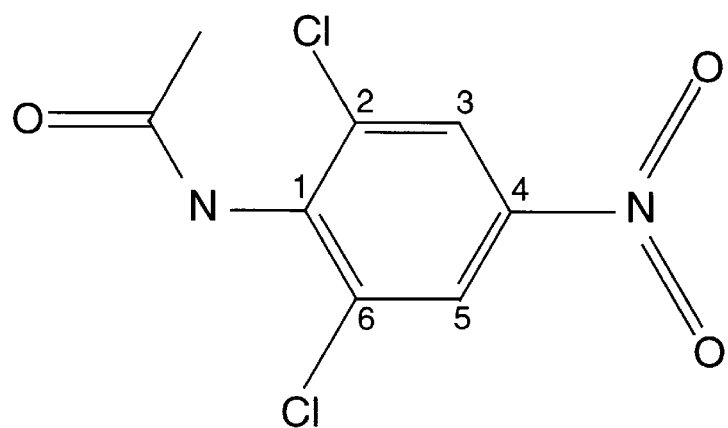
FIG. 1 shows structures used in Example 1.
Figure 1:
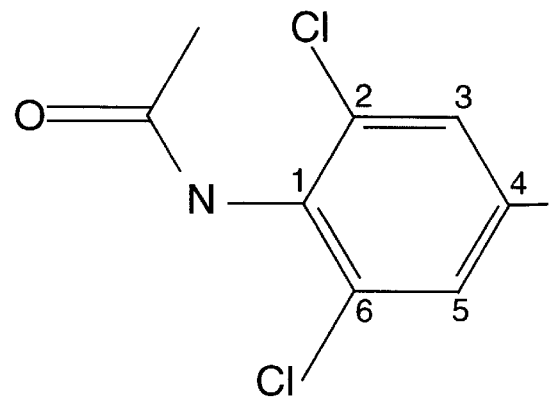
Figure 1:
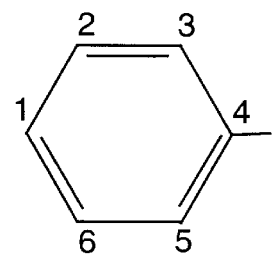
Figure 2:
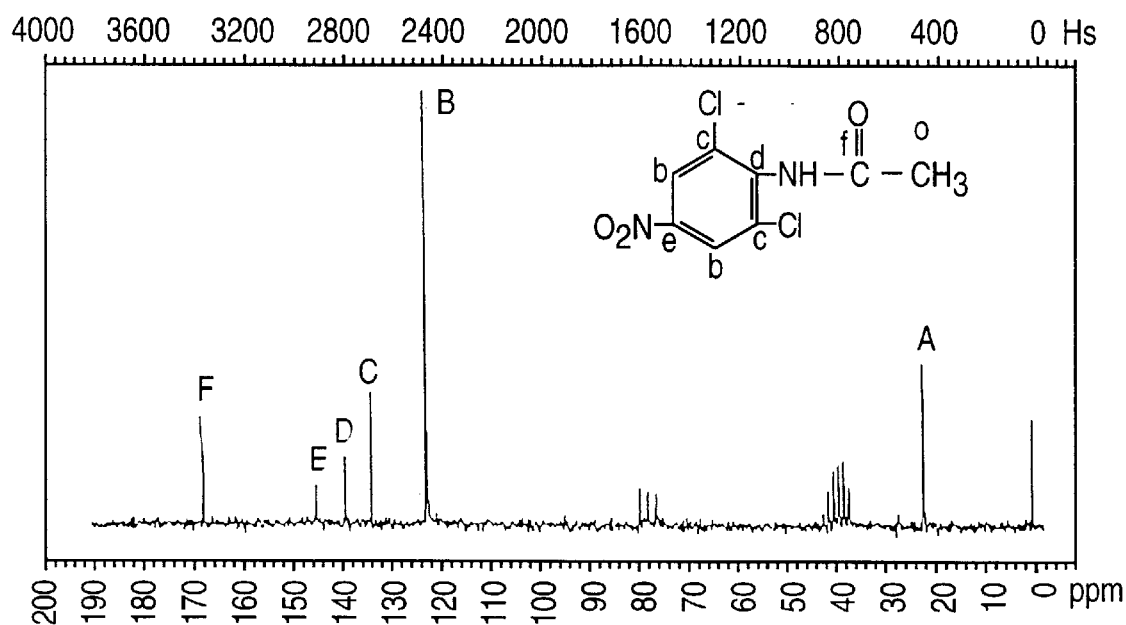
FIG. 2 shows and experimental spectrum.

In FIG. 1, formula (I) shows the assumed structure of the compound being studied. In the $^{13}$C-NMR spectrum of FIG. 2 the shifts of the 6 carbon atoms are indicated by the numerals 1, 2/6, 3/5, 4. The corresponding numerical values are listed in Table 5 in the column "Experiment".

For atom No. 1, a fourth data signal was calculated as follows and shown in Table 5 under the column heading "3-spheres HOSE code with increment".

First of all, among the known, existing shifts for compounds having the substructure S1 as shown in FIG. 1 under (II) and the respective substitution Sv (referred to as "R" in Table 1) were calculated from a database and shown in Table 1 in column 1. For a second substructure S2 as shown in FIG. 1 under (III) (simple benzene ring), the increment for the substitution R on this second substructure was then determined. In concrete terms, the first value (1) in line 1, therefore represents the difference between the measured chemical shifts for C atom 1 in benzene and aniline. These increment values represent the second data signal for the respective compound. These increment values (2) are subtracted from the first data signals (1) giving the result (3). The various shifts relating to the same substructure (no substitution in position 4) are averaged giving the result (4). Finally, the increment value (5) for the difference of the shift between nitrobenzene and benzene is calculated as the third data signal. The sum (6) (137.7) of the second and third data signal represents the fourth data signal. This value is also shown in the summarizing Table 5, line 1, for atom 1.

This procedure is repeated for the atoms 2, 3 and 4. The results are shown in Tables 2, 3 and 4. The substituents in question for the p-position with respect to the C atom being studied are specified in the respective columns 1.

Table 5 represents the results for comparison. In the process, the absolute deviations between the measured value (column 2) and the 3-spheres HOSE code value on its own (column 4), between the measured value (column 2) and the increment value on its own (column 3), and between the measured value (column 2) and the fourth data signal according to the invention (column 5) were calculated, the signals for the C atoms 2 and 3 each being counted doubly (C atoms 6 and 5). It can be seen that the sum of the deviations is considerably smaller for the novel method than for verification by means of either the HOSE code on its own or by means of only the increments based on benzene. As a result, the reliability of the verification or of the analysis result is considerably increased.

Tables 1–4: Data for computing the chemical shifts.
$R^1$="unknown" radical (fourth sphere),
1=experimental chemical shift with radical R,
2=increment in accordance with Pretsch et al., 3=chemical shift standardized to H,
4=standardized mean,
5=increment for radical R of the compound to be verified
6=computed value.
All values in ppm.
Column 3=column 1−column 2
Column 6=column 4+column 5

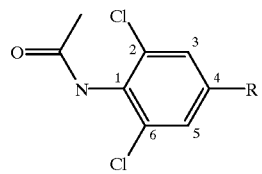

TABLE 1

(Computation of the chemical shift of C atom 1)

| R (on atom 4) | 1 | 2 | 3 | 4 | 5 | 6 |
|---|---|---|---|---|---|---|
| NH$_2$ | 120.3 | −9.5 | 129.8 | 131.7 | 6 | 137.7 |
| H | 130.6 | 0 | 130.6 | | | |
| H | 131.5 | 0 | 131.5 | | | |
| SO$_2$C | 137.7 | 5.1 | 132.6 | | | |
| NO$_2$ | 139.8* | 6.0 | 133.8 | | | |

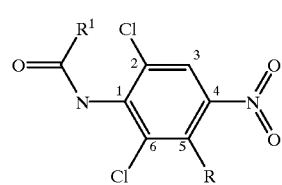

TABLE 2

(Computation of the chemical shift of C atom 2)

| R (on atom 5) | 1 | 2 | 3 | 4 | 5 | 6 |
|---|---|---|---|---|---|---|
| H | 134.1 | 0 | 134.1 | 134.2 | 0 | 134.2 |
| H | 134.2 | 0 | 134.2 | | | |
| H | 134.4* | 0 | 134.4 | | | |

*Different radicals R$^1$ give rise to the differing values.

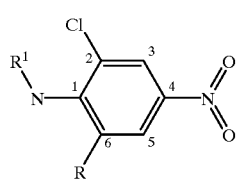

TABLE 3

(Computation of the chemical shift of C atom 3)

| R (on atom 6) | 1 | 2 | 3 | 4 | 5 | 6 |
|---|---|---|---|---|---|---|
| Cl | 123.0 | −2 | 125.0 | 124.7 | 0 | 124.7 |
| Cl | 123.7 | −2 | 125.7 | | | |
| Cl | 123.8 | −2 | 125.8 | | | |
| Cl | 124.0 | −2 | 126.0 | | | |

TABLE 3-continued (Computation of the chemical shift of C atom 3)

| R (on atom 6) | 1 | 2 | 3 | 4 | 5 | 6 |
|---|---|---|---|---|---|---|
| H | 125.0 | 0 | 125.0 | | | |
| H | 125.6 | 0 | 125.6 | | | |
| H | 125.9 | 0 | 125.9 | | | |
| SO$_3$H | 127.3 | 3.8 | 123.5 | | | |
| SO$_3$H | 127.5 | 3.8 | 123.7 | | | |
| SO$_3$H | 127.8 | 3.8 | 124.0 | | | |
| NO$_2$ | 128.5 | 6 | 122.5 | | | |
| NO$_2$ | 129.6 | 6 | 123.6 | | | |

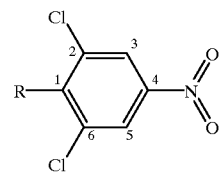

TABLE 4

(Computation of the chemical shift of C atom 4)

| R (on atom 1) | 1 | 2 | 3 | 4 | 5 | 6 |
|---|---|---|---|---|---|---|
| OH | 140.9 | −7.3 | 148.2 | 149.7 | 6 | 143.7 |
| OH | 141.1 | −7.3 | 148.4 | | | |
| OCH$_2$R | 143.4 | −8.1 | 151.5 | | | |
| F | 143.7 | −4.4 | 148.1 | | | |
| F | 144.0 | −4.4 | 148.4 | | | |
| F | 144.0 | −4.4 | 148.4 | | | |
| OPh | 144.8 | −5.3 | 150.1 | | | |
| NHCOCH$_3$ | 146.2 | −5.6 | 151.8 | | | |
| NHCOCH$_3$ | 146.2 | −5.6 | 151.8 | | | |
| I | 147.8 | −0.4 | 148.2 | | | |
| H | 149.2 | 0.0 | 149.2 | | | |
| H | 149.2 | 0.0 | 149.2 | | | |

TABLE 5

(Compilation)

| Atom | Experiment | Increment$^1$ | 3-spheres HOSE Code | According to the invention |
|---|---|---|---|---|
| 1 | 139.8 | 147.7 | 132 | 137.7 |
| 2/6 | 134.4 | 128.0 | 134.2 | 134.2 |
| 3/5 | 123.3 | 122.3 | 125.8 | 124.7 |
| 4 | 145.7 | 146.8 | 145 | 143.7 |
| Σ | 543.2 | 23.8 | 13.9 | 5.7 |

EXAMPLE 2

The same procedure was followed as in Example 1. The compound studied was:

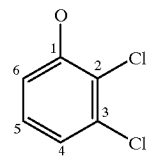

This gave the following results:

Comparison of the experimental and computed chemical shifts for 1 in ppm. (The bottom line shows the sum of deviations in ppm.)

| Atom | Experiment | Increment[1] | 3-spheres HOSE Code | According to the invention |
|---|---|---|---|---|
| 1 | 152.7 | 159.1 | 154.3 | 153.6 |
| 2 | 119.1 | 121.4 | 120.7 | 119.4 |
| 3 | 132.7 | 135.6 | 134.9 | 133.4 |
| 4 | 122.3 | 122.9 | 121.1 | 122 |
| 5 | 128 | 129.4 | 128.7 | 127.9 |
| 6 | 114.5 | 115.2 | 114.3 | 114.5 |
| Σ | | 14.3 | 7.5 | 2.3 |

[1]Prof. Pretsch

EXAMPLE 3

The same procedure was followed as in Example 1. The compound studied was:

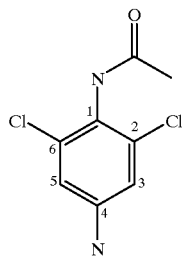

This gave the following results:

Comparison of the experimental and computed chemical shifts in ppm. (The bottom line shows the sum of the deviations in ppm.)

| Atom | Experiment | Increment[1] | 3-spheres HOSE Code with first correction | According to the invention |
|---|---|---|---|---|
| 1 | 120.3 | 131.6 | 132 | 121.8 |
| 2/6 | 133.9 | 127.9 | 133.9 | 133.9 |
| 3/5 | 112.8 | 113.8 | 115.3 | 113.9 |
| 6 | 148.8 | 145.1 | 146 | 145 |
| Σ | | 29 | 19.5 | 7.5 |

[1]SpecTool

EXAMPLE 4

The same procedure was followed as in Example 1. The compound studied was:

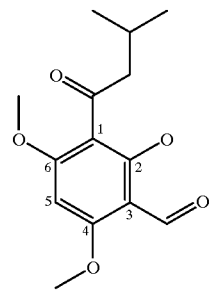

This gave the following results:

| Atom | Experiment | Increment | 3-spheres HOSE Code with first correction | According to the invention |
|---|---|---|---|---|
| 1 | 106 | 103.0 | 121.0 | 103.1 |
| 2 | 165 | 160.6 | 170.4 | 164.5 |
| 3 | 111 | 101.7 | 108.2 | 103.2 |
| 4 | 165 | 170.0 | 163.8 | 167.5 |
| 5 | 86 | 92.7 | 92.2 | 87.6 |
| 6 | 163 | 170.3 | 163 | 163.6 |
| Δ (Exp. prediction) | | 36.9 | 30.6 | 15.9 |

[1]SpecTool

In all the examples the novel method gave considerably better approximations between the actual data and the values predicted from existing data than did the other two methods.

EXAMPLE 5

The following table shows the result of the novel method for a nonaromatic molecule. This was based on 2-spheres substructures. The increments were again taken from the "Pretsch book". For atom No. 8, an increment was generated from a database.

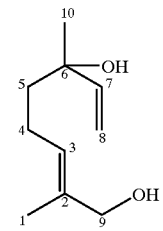

| Atom | Experiment | Increments | 2-spheres HOSE Code | According to the invention |
|---|---|---|---|---|
| 1 | 13.7 | 13.1 | 18.8 | 14.9 |
| 2 | 134.9 | 138.0 | 135.2 | 134.7 |
| 3 | 125.7 | 125.0 | 123.2 | 124.9 |
| 4 | 22.4 | 18.5 | 27.9 | 20.7 |
| 5 | 41.8 | 43.8 | 36.1 | 42.2 |
| 6 | 73.3 | 72.2 | 73.0 | 71.3 |
| 7 | 144.9 | 140.6 | 143.7 | 145.6 |
| 8 | 111.8 | 114.4 | 116.1 | 111.6 |
| 9 | 68.3 | 72.9 | 62.7 | 64.2 |
| 10 | 27.7 | 27.7 | 26.6 | 26.6 |
| Δ/ΣC | | 2.24 | 3.15 | 1.23 |

The computation with 3-spheres HOSE codes produces a deviation of 0.97. The novel method therefore produces an approximation, on the basis of 2-spheres HOSE code values and increment values, which is virtually as good as actual measurements for corresponding 3-spheres substructures. A sphere is therefore gained, as it were.

We claim:

1. A method for the structural analysis of a chemical compound by means of carbon-13 NMR-data signals measured with the chemical compound being compared with calculated data signals, wherein a) an assumed structure has a first substructure S1 comprising a substitution position and a substitution Sa situated therein;

b) a first data signal is determined for at least one first compound of a structure having the same first substructure, but a different substituent Sv in the substitution position;

c) a second data signal is determined which constitutes the difference between the data from a second compound having a second substructure S2 which is present in the first substructure S1 and likewise has the substitution position and therein carries the substituent Sv, and those from a third compound which matches the second compound, but does not carry the substituent Sv in the substitution position;

d) a third data signal is determined which constitutes the difference between the data from a fourth compound having a third substructure S3 which is present in the first substructure S1 and likewise has the substitution position and therein carries the substituent Sa, and those from a fifth compound which matches the fourth compound, but does not carry the substituent Sa in the substitution position;

e) a fourth data signal is calculated by means of the first data signal being corrected, with the aid of the second data signal and the third data signal, to a data signal which corresponds to the assumed structure;

f) the measured data signal and the fourth data signal are compared with one another, wherein a plurality of first data signals is determined for a corresponding plurality of different first compounds, for each of the different first compounds the corresponding second data signal is determined for the respective substitution Sv of said first compounds and is subtracted from the first data signal, and a mean is formed, as the mean first standardized data signal, from the individual results obtained, the mean first standardized data signal having the third data signal added to it, for the fourth data signal to be obtained.

2. A method as claimed in claim 1, wherein the fourth data signal is calculated by ea.) at least one first standardized data signal being determined by means of the increment for the substitution Sv, corresponding to the difference between the data from the second and third compounds, being subtracted from the corresponding first data signal;

eb.) the increment for the substitution Sa, corresponding to the difference between the data from the fourth and fifth compound, being added to the first standardized data signal.

3. A method as claimed in claim 2, wherein the first data signal and the component signals of the second data signal and of the third data signal, or the second data signals and the third data signals themselves are calculated automatically from a computer on the basis of the input of the substructures and substitutions.

4. A method as claimed in claim 2, wherein the measured data signals, the first, second and third data signals and their component signals represent $^{13}$C-NMR signals, for the corresponding compounds.

5. A method as claimed in claim 2, wherein the measured data signals, the first, second and third data signals and their component signals represent $^{13}$C-NMR signals, for the corresponding compounds, wherein the substitution Sa with respect to the C atom under consideration represents a substitution on the fourth atom starting from the atom under consideration as the first atom.

* * * * *

UNITED STATES PATENT AND TRADEMARK OFFICE
CERTIFICATE OF CORRECTION

PATENT NO. : 6,051,438
DATED : April 18, 2000
INVENTOR(S) : Martin Will, et al.

It is certified that error appears in the above-indentified patent and that said Letters Patent is hereby corrected as shown below:

Column 10, claim 2, line 13, after "ea" delete the period "."

Column10, claim 2, line 17 after "eb" delete the period"."

Signed and Sealed this

Twenty-seventh Day of March, 2001

Attest:

NICHOLAS P. GODICI

Attesting Officer

Acting Director of the United States Patent and Trademark Office